United States Patent
Lin et al.

(10) Patent No.: US 6,211,027 B1
(45) Date of Patent: Apr. 3, 2001

(54) METHOD FOR MANUFACTURING PMOS TRANSISTOR

(75) Inventors: Tony Lin, Kaohsiung Hsien; C. C. Hsue, Hsinchu, both of (TW)

(73) Assignees: United Microelectronics Corp.; United Silicon Incorporated, both of Hsinchu (TW)

( * ) Notice: Subject to any disclaimer, the term of this patent is extended or adjusted under 35 U.S.C. 154(b) by 0 days.

(21) Appl. No.: 09/444,278

(22) Filed: Nov. 19, 1999

(51) Int. Cl.⁷ .................................................. H01L 21/336
(52) U.S. Cl. ............................................ 438/303; 438/655
(58) Field of Search .................................... 438/303, 305, 438/197, 299, 655

(56) References Cited

U.S. PATENT DOCUMENTS

| | | | |
|---|---|---|---|
| 5,405,791 | * 4/1995 | Ahmad et al. | 437/34 |
| 5,702,986 | * 12/1997 | Mathews et al. | 438/163 |
| 5,866,460 | * 2/1999 | Akram et al. | 438/306 |
| 5,899,719 | * 5/1999 | Hong | 438/289 |
| 5,981,383 | * 11/1999 | Lur et al. | 438/655 |
| 6,015,752 | * 1/2000 | Xiang et al. | 438/655 |

* cited by examiner

Primary Examiner—Amir Zarabian
Assistant Examiner—Brad Smith
(74) Attorney, Agent, or Firm—Charles C. H. Wu; Charles C. H. Wu & Associates

(57) ABSTRACT

A method for manufacturing a PMOS transistor. A gate terminal is formed over a substrate. Spacers are formed on the sidewalls of the gate terminal. A source/drain terminal is formed in the substrate on each side of the gate terminal, and then a metal silicide layer is formed over the top surface of the gate terminal and the substrate. The spacers are next removed. Using the metal silicide layer as a mask, a source/drain extension region is formed in the substrate between the gate terminal and the source/drain terminal. Similarly, using the metal silicide layer as a mask, an anti-punchthrough region is form in the substrate interior under the source/drain extension region.

22 Claims, 3 Drawing Sheets

METHOD FOR MANUFACTURING PMOS TRANSISTOR

BACKGROUND OF THE INVENTION

1. Field of the Invention

The present invention relates to a method for manufacturing a semiconductor device. More particularly, the present invention relates to a method for manufacturing a P-type metal-oxide-semiconductor (PMOS) transistor.

2. Description of the Related Art

Advances in the techniques of miniaturizing and integrating devices together have made the fabrication of deep submicron circuits possible. Due to a reduction of line width, contact area and junction depth, contact resistance is increased correspondingly. With an increase in contact resistance, signal transmission rate is reduced. To decrease contact resistance and increase signal transmission rate, an additional self-aligned silicide layer is usually formed on top of each contact terminal.

In general, the self-aligned silicide layer is formed only after the gate terminal, the spacers and the source/drain terminals of a MOS transistor are all formed. The self-aligned silicide process includes sputtering titanium over the MOS transistor. A first rapid thermal process (RTP) is next carried out at a temperature between about 620 and 680° C. in a nitrogen-filled atmosphere. Titanium reacts with silicon to form a C-49 phase titanium silicide layer over the gate terminal and the source/drain terminals. Titanium nitride and unreacted titanium is subsequently removed. A second rapid thermal process (RTP) is carried out at a temperature between about 800 and 900° C. to the C-49 phase titanium silicide into C-54 phase titanium silicide. Since no photolithographic processing step is involved, the self-aligned silicide process has become a highly attractive method for making metal contacts.

In the manufacturing of MOS transistor with a feature line width smaller than 0.18μm, the second rapid thermal process is usually carried out at a temperature below 850° C. for a duration of about 20 seconds. However, when the titanium silicide layer has a narrow line width, the so-called narrow line width effect becomes dominant. In other words, due to the presence of a smaller number of nucleation sites, phase transition of titanium silicide layer from the high resistance C-49 phase to a low resistance C-54 phase is harder. To ease the phase transition, the second RTP must be carried out at a higher temperature. Alternatively, the titanium silicide is heated to a temperature of about 850° C. and maintained there for a period of about 10 seconds. The temperature of the titanium silicide is suddenly raised to about 975° C. for a brief moment followed by a rapid cooling. Rapid cooling prevents the agglomeration of titanium silicide at high temperature, which might damage the surface structure at the gate and the source/drain terminals.

FIG. 1 is a graph plotting sheet resistance of titanium silicide versus NMOS polysilicon critical dimension for a second rapid thermal process of heating to 850° C. (plotted with squares) and a second rapid thermal process of heating to 850° C. with a spike heating up to 975° C. (plotted with circles). The instantaneous heating and rapid cooling of the titanium silicide layer is quite effective in reducing the resistance of titanium silicide layer. In particular, when critical dimension of feature line width is reduced to 0.14 μm, sheet resistance Rs at the source/drain terminals can still be maintained at around 4 Ω/□ (ohms/square unit). Consequently, a relatively high process window is provided. Compared with heating to a temperature of about 850° C. for a duration of 20 seconds, sheet resistance at the source/drain terminal reaches 10 Ω/□ when critical dimension of feature line wide is reduced to 0.14 μm.

However, a sharp increase in temperature followed by rapid cooling for transforming the phase of the titanium silicide layer causes some problems for the P-type MOS transistors. This is because boron ions are often used as dopants in the source/drain terminals of a PMOS transistor. Since boron ions have a relatively small ionic radius, the ions can easily diffuse into the silicon oxide layer on the surface of the silicon substrate when the temperature is raised to about 975° C. in the second RTP. An outward diffusion of boron ions lowers the dopant concentration in the source/drain terminals. Consequently, there is a lowering of drain current ($I_D$). FIG. 2 is a graph plotting residual drain current $I_{off}$ versus ion concentration for a PMOS transistor having a silicide layer formed by a conventional self-aligned silicide process (plotted with squares) and a PMOS transistor having a silicide layer formed by a self-aligned silicide process with a spike heating up to 975° C. (plotted with circles). For identical residual current $I_{off}$ when both PMOS transistors are off, drain current $I_{on}$ of a PMOS transistor is attenuated by about 8% if spike temperature heating has been used during the silicide process.

SUMMARY OF THE INVENTION

The invention provides a method for manufacturing a PMOS transistor. To form the PMOS transistor, a P-type substrate is provided. A gate terminal is formed over the substrate. Spacers are formed on the sidewalls of the gate terminal. A source/drain terminal is formed in the substrate on each side of the gate terminal, and then a metal suicide layer is formed over the top surface of the gate terminal and the substrate. The spacers are then removed. Using the metal silicide layer as a mask, a source/drain extension region is formed in the substrate between the gate terminal and the source/drain terminal. Similarly, using the metal silicide layer as a mask, an anti-punchthrough region is formed in the substrate interior under the source/drain extension region.

In this invention, the source/drain extension region is formed after the metal silicide layer is formed over the gate terminal and the source/drain terminals. There are several advantages to this processing arrangement. First, processing parameters in the original self-aligned silicide process can be retained so that a PMOS transistor with better electrical properties is obtained. Second, concentration of dopants within the source/drain terminals can be maintained so that attenuation of drain current due to heat processing can be prevented. Third, the self-aligned silicide layer serves directly as an ion mask for forming the source/drain extension region and the anti-punchthrough region of the PMOS transistor. Hence, the increase in junction capacitance due to the implantation of ions into the lower edge of the source/drain terminals can be prevented.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
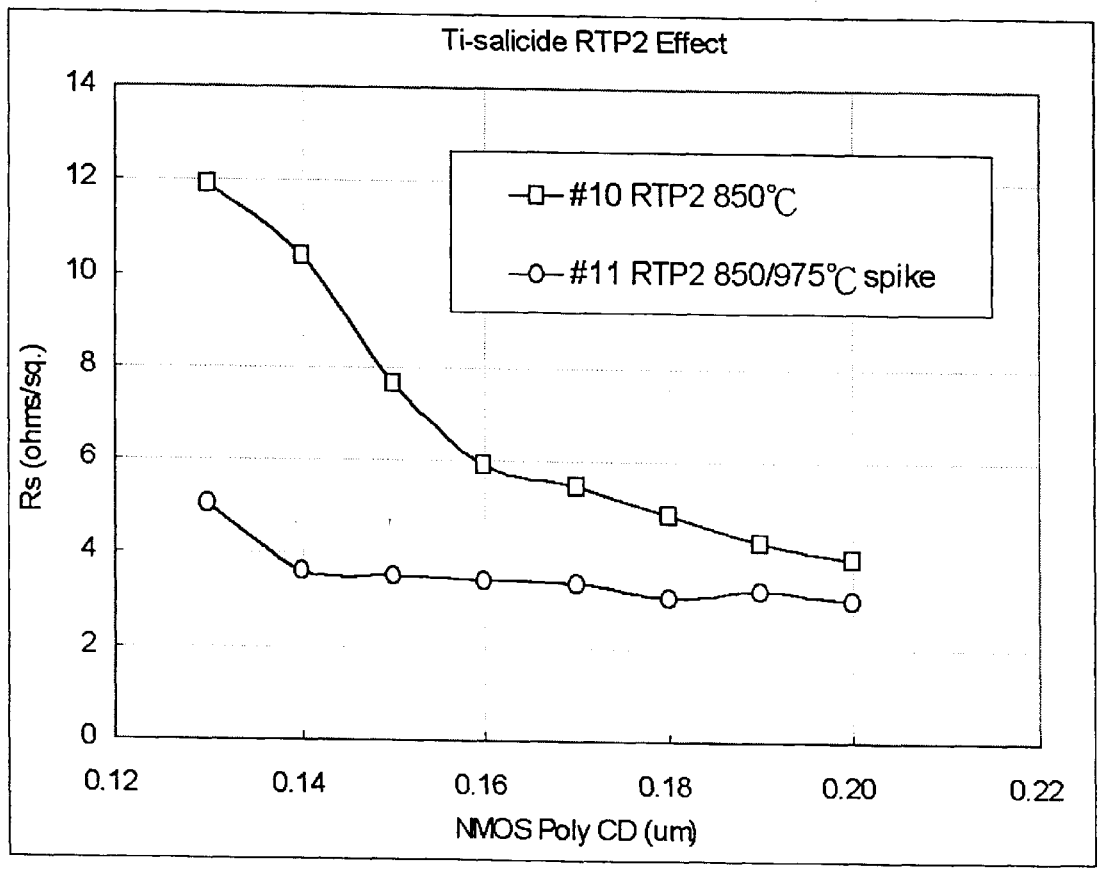
FIG. 1 is a graph plotting sheet resistance of titanium silicide versus NMOS polysilicon critical dimension for a second rapid thermal process of heating to 850° C. plotted with squares) and a second rapid thermal process of heating to 850° C. with a spike heating up to 975° C. (plotted with circles)
Figure 2:
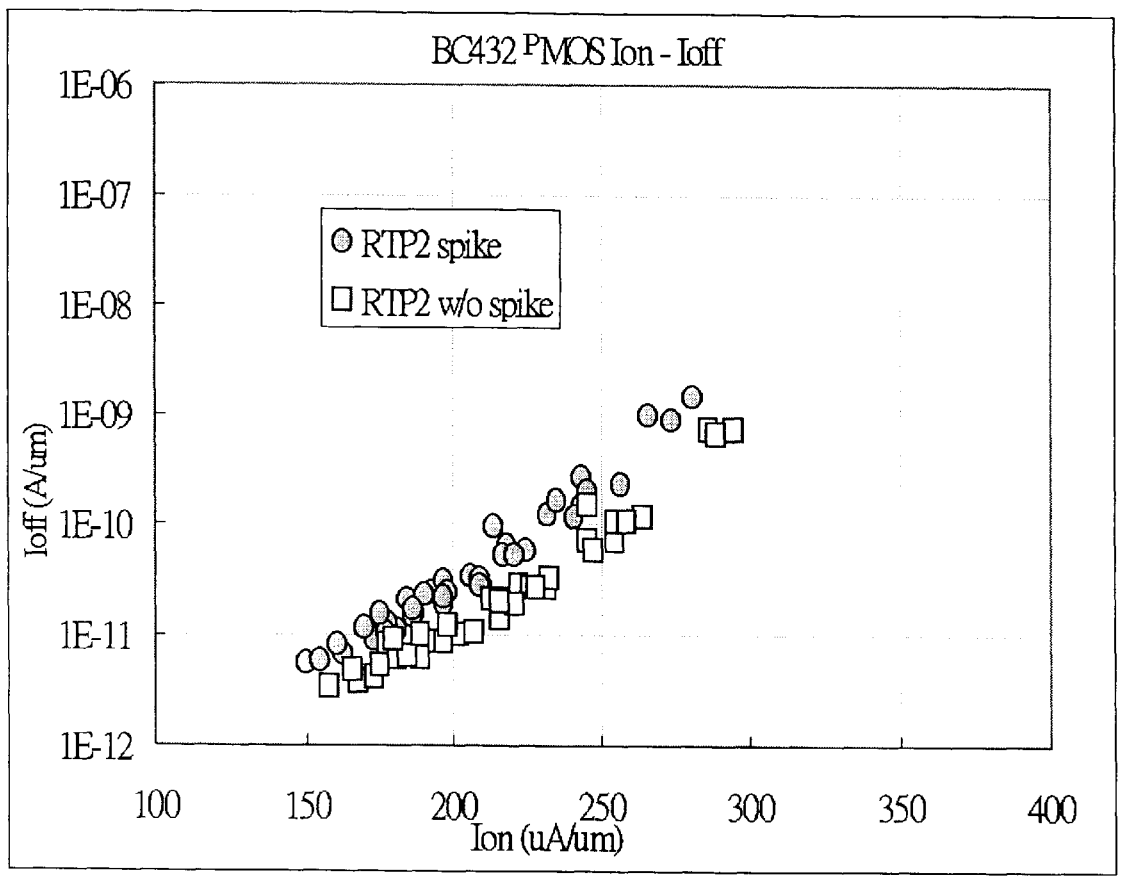
FIG. 2 is a graph plotting residual drain current Ioff versus ion concentration for a PMOS transistor having a silicide layer formed by a conventional self-aligned silicide process (plotted with squares) and a PMOS transistor having a silicide layer formed by a self-aligned silicide process with a spike heating up to 975° C. (plotted with circles)

Reference will now be made in detail to the present preferred embodiments of the invention, examples of which are illustrated in the accompanying drawings. Wherever possible, the same reference numbers are used in the drawings and the description to refer to the same or like parts.

Figure 3A:
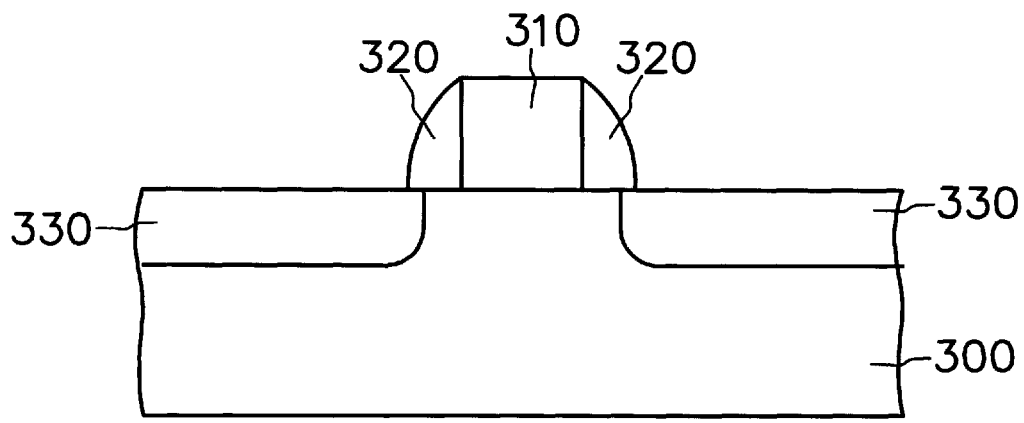
FIGS. 3A through 3C are schematic cross-sectional views showing the progression of manufacturing steps for producing a PMOS transistor according to one preferred embodiment of this invention.
Figure 3B:
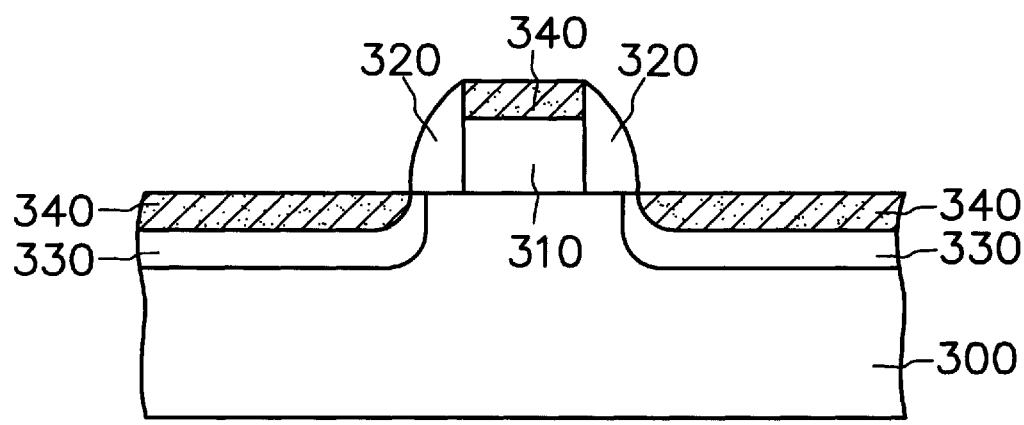
Figure 3C:
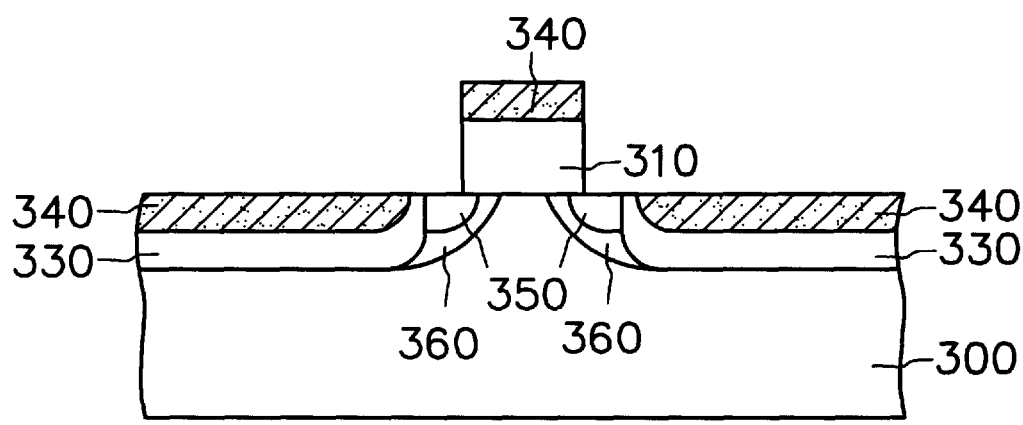

FIGS. 3A through 3C are schematic cross-sectional views showing the progression of manufacturing steps for producing a PMOS transistor according to one preferred embodiment of this invention.

As shown in FIG. 3A, a substrate 300 is provided. A gate terminal 310 is formed over the substrate 300, and then spacers 320 are formed on the sidewalls of the gate terminal 310. Using the gate terminal 310 and the spacers 320 as a mask, an ion implantation is carried out to form source/drain regions 330 in the substrate 300 on each side of the gate terminal 310. The gate terminal can be formed using polysilicon and the spacers can be formed using silicon nitride, for example.

As shown in FIG. 3B, a metal silicide layer 340 is formed in the top surfaces of the gate terminal 310 and the substrate 300. The metal silicide layer can be a titanium silicide layer formed, for example, by performing a self-aligned silicide process.

To form a titanium silicide layer in the top surfaces of the gate terminal 310 and the substrate, a titanium layer is first deposited over the entire substrate. A first rapid thermal process (RTP) is next carried out at a temperature of between about 620 and 680° C. so that titanium and silicon (in the gate terminal 310 and the substrate 300) react to form a C-49 phase titanium nitride layer 340. Unreacted titanium is selectively removed, for example, by etching using a $NH_3/H_2O_2$ solution. A second RTP is carried out to transform the high resistance C-49 phase titanium silicide into low resistance C-54 phase titanium silicide. The second RTP is conducted by heating the titanium silicide to a temperature of about 850° C. for 10 seconds, and then raising the titanium silicide to an even higher temperature of about 975° C. quickly followed by a rapid cooling.

As shown in FIG. 3C, the spacers 320 are removed. Using the gate terminal 310 and the metal silicide layer 340 as a mask, ions are implanted into the exposed substrate 300. Ultimately, a source/drain extension (SDE) region 350 and an anti-punchthrough region 360 are formed in the substrate 300.

The source/drain extension region 350 and the source/drain region 330 are electrically similar because both are P-doped. Therefore, the extension region 350 can be formed, for example, by implanting $BF_2^+$ ions into the substrate 300 to a depth of about 400 Å to 600 Å below the substrate surface. The implantation can be carried out at an energy level of between about 5 and 10 KeV and a dosage of between about $3 \times 10^{14}$ and $2 \times 10^{15}$ cm$^2$.

The anti-punchthrough region 360, however, is electrically opposite to the source/drain region 330 and hence must be formed by doping with N-type ions. Consequently, the anti-punchthrough region 360 is formed by implanting arsenic ions into the substrate 300 to a depth of about 600 Å to 1000 Å below the substrate surface. The implantation can be carried out at an energy level of between about 100 and 200 KeV and a dosage of between about $5 \times 10^{12}$ and $5 \times 10^{13}$ cm$^{-2}$.

In the subsequent step, insulation material is deposited to form an insulation layer, and contact plugs are formed in the insulation layer for connecting various electrical devices. Since these processes are familiar to those skilled in the art of semiconductor fabrication, details are not repeated here.

In this invention, the source/drain extension region is formed after the metal silicide layer is formed over the gate terminal and the source/drain terminals. The advantages for this arrangement includes:

1. The same processing parameters used in the original self-aligned silicide process can be used so that a PMOS transistor with low resistance metal silicide over its terminals can be obtained. Moreover, the out-diffusion of dopants from the source/drain terminals during heating can be compensated for by subsequent ion implantation. Hence, attenuation of drain current can be prevented.

2. The number of heating episodes after the source/drain extension region is formed is fewer. The source/drain extension region can have a shallower junction depth so that short channel effect is minimized.

3. The original spacers are replaced by insulation material. Generally, the spacers are formed using silicon nitride while the insulation layer is formed by depositing silicon oxide. Since the dielectric constant of silicon oxide is considerably less than silicon nitride, capacitance of the fringe capacitor formed between a gate terminal and its neighboring source/drain terminal decreases. Therefore, delay in signal transmission due to RC impedance can be reduced.

4. The self-aligned silicide layer serves directly as an ion mask for forming the anti-punchthrough region of the PMOS transistor. Hence, the anti-punchthrough regions are formed only in the interior of the substrate next to the source/drain region. Since no anti-punchthrough layer is formed under the source/drain terminal regions, thickness of the depletion layer under the source/drain terminals can be maintained. A thick depletion layer is able to keep the junction capacitance low, and thus delay in signal transmission due to RC impedance is reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for manufacturing a PMOS transistor, comprising the steps of:

providing a substrate;

forming a gate electrode over the substrate;

forming a spacer on a sidewall of the gate electrode;

forming a source/drain region in the substrate on each side of the gate electrode, using the gate electrode and the spacer as a mask;

forming a metal silicide layer on the gate electrode and the substrate;

removing the spacer;

forming a source/drain extension region in the substrate between the gate electrode and the source/drain region, using the aate electrode and the metal silicide layer as a mask; and forming an anti-punch through region in a substrate interior under the source/drain extension region, using the gate electrode and the metal silicide layer as a mask.

2. The method of claim 1, wherein step of forming the source/drain extension region includes implanting boron difluoride ions ($BF_2^+$).

3. The method of claim 1, wherein the step of forming the source/drain extension region includes doping with ions accelerated to an energy level of between about 5 and 10 KeV.

4. The method of claim 1, wherein the step of forming the source/drain extension region includes doping ions into the substrate to a depth of between about 400 Å and 600 Å.

5. The method of claim 1, wherein the step of forming the source/drain extension region includes doping with ions concentrated to a dosage of between about $3\times10^{14}$ and $2\times10^{15}$ cm$^2$.

6. The method of claim 1, wherein step of forming the anti-punchthrough region includes implanting arsenic ions.

7. The method of claim 1, wherein the step of forming the anti-punchthrough region includes doping with ions accelerated to an energy level of between about 100 and 200 KeV.

8. The method of claim 1, wherein the step of forming the anti-punchthrough region includes doping ions into the substrate to a depth of between about 600 Å and 1000 Å.

9. The method of claim 1, wherein the step of forming the anti-punchthrough region includes doping with ions concentrated to a dosage of between about $5\times10^{12}$ and $5\times10^{13}$ cm$^{-2}$.

10. A method of compensating for an attenuation of drain current after performing a self-aligned silicide process during the fabrication of a PMOS transistor on a substrate, wherein the PMOS transistor includes a gate electrode and a source/drain region in the substrate at each side of the gate electrode, having a distance to the gate electrode, comprising the steps of:

forming a metal silicide layer on the gate electrode and the source/drain region; and forming a source/drain extension region in the substrate between the gate electrode and the source/drain region, using the gate electrode and the metal silicide as a mask.

11. The method of claim 10, wherein step of forming the source/drain extension region includes implanting boron difluoride ions ($BF_2^+$).

12. The method of claim 10, wherein the step of forming the source/drain extension region includes doping with ions accelerated to an energy level of between about 5 and 10 KeV.

13. The method of claim 10, wherein the step of forming the source/drain extension region includes doping ions into the substrate to a depth of between about 400 Å and 600 Å.

14. The method of claim 10, wherein after the step of forming the source/drain extension region, further includes forming a punchthrough region in a substrate interior under the source/drain extension region.

15. The method of claim 10, wherein the step of forming the source/drain extension region includes doping with ions concentrated to a dosage of between about $3\times10^{14}$ and $2\times10^{15}$ cm$^{-2}$.

16. The method of claim 15, wherein step of forming the anti-punchthrough region includes implanting arsenic ions.

17. The method of claim 15, wherein the step of forming the anti-punchthrough region includes doping with ions accelerated to an energy level of between about 100 and 200 KeV.

18. The method of claim 15, wherein the step of forming the anti-punchthrough region includes doping ions into the substrate to a depth of between about 600 Å and 1000 Å.

19. The method of claim 15, wherein the step of forming the anti-punchthrough region includes doping with ions concentrated to a dosage of between about $5\times10^{12}$ and $5\times10^{13}$ cm$^{-2}$.

20. A method for manufacturing a MOS transistor, comprising the steps of:

providing a substrate;

forming a gate electrode on the substrate;

forming a spacer on a sidewall of the gate electrode;

forming a source/drain region in the substrate at each side of the gate electrode, using the gate electrode and the spacer as a mask;

forming a metal silicide layer on the gate electrode and the source/drain region;

removing the spacer to expose a portion of the substrate without being doped;

forming a source/drain extension region in the substrate between the gate electrode and the source/drain region, using the gate electrode and the metal silicide layer as a mask; and forming an anti-punch through region in a substrate interior under the source/drain extension region, using the gate electrode and the metal silicide layer as a mask.

21. The method of claim 20, wherein the step of forming the source/drain extension region includes doping with ions accelerated to an energy level of between about 5 KeV and 10 KeV.

22. The method of claim 20, wherein the step of forming the source/drain extension region includes doping ions into the substrate to a depth of between about 400 angstroms and 600 angstroms.

* * * * *